United States Patent
Park et al.

(10) Patent No.: US 12,426,294 B2
(45) Date of Patent: Sep. 23, 2025

(54) HIGH ELECTRON MOBILITY TRANSISTOR

(71) Applicant: Samsung Electronics Co., Ltd., Suwon-si (KR)

(72) Inventors: Younghwan Park, Seongnam-si (KR); Woochul Jeon, Suwon-si (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 884 days.

(21) Appl. No.: 17/679,288

(22) Filed: Feb. 24, 2022

(65) Prior Publication Data

US 2023/0019799 A1    Jan. 19, 2023

(30) Foreign Application Priority Data

Jul. 13, 2021    (KR) .......................... 10-2021-0091855

(51) Int. Cl.
*H10D 30/47*    (2025.01)
*H10D 64/00*    (2025.01)

(52) U.S. Cl.
CPC ......... *H10D 30/475* (2025.01); *H10D 64/111* (2025.01)

(58) Field of Classification Search
CPC ............. H10D 62/8503; H10D 62/124; H10D 30/4755
See application file for complete search history.

(56) References Cited

U.S. PATENT DOCUMENTS

| | | | |
|---|---|---|---|
| 7,714,360 B2 | 5/2010 | Otsuka et al. | |
| 8,148,752 B2 | 4/2012 | Ikoshi et al. | |
| 8,350,294 B2 | 1/2013 | Lidow et al. | |
| 8,816,396 B2 | 8/2014 | Hwang et al. | |
| 10,741,682 B2 | 8/2020 | Jeon et al. | |
| 10,833,159 B1 | 11/2020 | Hao et al. | |
| 10,991,803 B2 * | 4/2021 | Wong | H10D 62/8503 |
| 2014/0001478 A1 * | 1/2014 | Saunier | H10D 30/015 257/E21.403 |

(Continued)

FOREIGN PATENT DOCUMENTS

| | | |
|---|---|---|
| CN | 113066864 A | 7/2021 |
| JP | 2007/027284 A | 2/2007 |

(Continued)

OTHER PUBLICATIONS

Extended European Search Report dated Sep. 12, 2022 issued in corresponding European Appln. No. 22161945.5.

(Continued)

*Primary Examiner* — Mounir S Amer
(74) *Attorney, Agent, or Firm* — HARNESS, DICKEY & PIERCE, P.L.C.

(57) ABSTRACT

A high electron mobility transistor includes a channel layer; a barrier layer on the channel layer and having an energy bandgap greater than an energy bandgap of the channel layer; a gate structure on the barrier layer; a source electrode and a drain electrode spaced apart from each other on the barrier layer with the gate structure therebetween; a field plate electrically connected to the source electrode and extending above the gate structure; and a field dispersion layer in contact with the barrier layer and the drain electrode. The field dispersion layer may extend toward the gate structure.

20 Claims, 16 Drawing Sheets

(56) References Cited

U.S. PATENT DOCUMENTS

| | | | |
|---|---|---|---|
| 2014/0091319 A1 | 4/2014 | Yamada et al. | |
| 2021/0057560 A1* | 2/2021 | Cheng | H10D 62/824 |
| 2021/0343839 A1 | 11/2021 | Hao et al. | |
| 2022/0293779 A1* | 9/2022 | Du | H10D 62/8503 |

FOREIGN PATENT DOCUMENTS

| | | |
|---|---|---|
| JP | 2018-125500 A | 8/2018 |
| WO | WO-2011/004535 A1 | 1/2011 |

OTHER PUBLICATIONS

Office Action dated Dec. 15, 2022, issued in corresponding Korean Patent Application No. 10-2021-0091855.

\* cited by examiner

HIGH ELECTRON MOBILITY TRANSISTOR

CROSS-REFERENCE TO RELATED APPLICATION

This application is based on and claims priority under 35 U.S.C. § 119 to Korean Patent Application No. 10-2021-0091855, filed on Jul. 13, 2021 in the Korean Intellectual Property Office, the disclosure of which is incorporated by reference herein in its entirety.

BACKGROUND

1. Field

The disclosure relates to a high electron mobility transistor.

2. Description of the Related Art

In a power conversion system, the efficiency of a power switching device may highly affect the efficiency of the entire power conversion system. A power metal oxide semiconductor field effect transistor (MOSFET) or an insulated gate bipolar transistor (IGBT) using silicon has been mostly used as a switching device, but there may be a limitation in the increase of the efficiency of a switching device silicon due to a limitation of the material thereof. As an attempt to overcome the material limitation of silicon, research on high electron mobility transistor (HEMT) has been actively conducted.

An HEMT may include semiconductor layers having different electrical polarization characteristics. A semiconductor layer having a relatively large polarizability in the HEMT may induce a two-dimensional electron gas (2DEG) in another semiconductor layer that is heterogeneously bonded thereto. A 2DEG may be used as a channel between a drain electrode and a source electrode, and a current flowing through the channel may be controlled by a bias voltage applied to the gate electrode. An HEMT of a typical structure, for example, an HEMT using a heterojunction by a group III nitride semiconductor, may have a normally-on characteristic. In order to implement an HEMT having a normally-off characteristic, a gate semiconductor layer forming a depletion region in a channel may be employed.

SUMMARY

Provided is a high electron mobility transistor (HEMT) that distributes, in a normally-OFF state, an electric field generated between a drain electrode and a source electrode.

Provided is an HEMT that improves current collapse caused by an electronic trap.

Additional aspects will be set forth in part in the description which follows and, in part, will be apparent from the description, or may be learned by practice of the presented embodiments of the disclosure.

According to an embodiment, a high electron mobility transistor may include a channel layer; a barrier layer on the channel layer and having an energy bandgap greater than an energy bandgap of the channel layer, a gate structure on the barrier layer, a source electrode and a drain electrode spaced apart from each other on the barrier layer with the gate structure therebetween, a field plate electrically connected to the source electrode and extending above the gate structure, and a field dispersion layer in contact with the barrier layer and the drain electrode. The field dispersion layer may extend toward the gate structure.

In some embodiments, a partial area of the barrier layer may not overlap the field dispersion layer.

In some embodiments, the partial area of the barrier layer may be between the gate structure and the drain electrode.

In some embodiments, an interval between the field plate and the field dispersion layer in a widthwise direction of the channel layer may be less than an interval between the gate structure and the drain electrode in the widthwise direction.

In some embodiments, a portion of the field dispersion layer may overlap the field plate in a thickness direction of the channel layer.

In some embodiments, a host material of the field dispersion layer may include a same material as the barrier layer.

In some embodiments, the field dispersion layer may include a p-type doped semiconductor material.

In some embodiments, the field dispersion layer may include a plurality of first field dispersion layers arranged apart from each other in a direction crossing a widthwise direction of the channel layer.

In some embodiments, the plurality of first field dispersion layers may be arranged apart from each other in a direction perpendicular to a widthwise direction of the channel layer.

In some embodiments, at least one of the plurality of first field dispersion layers may be in contact with the drain electrode.

In some embodiments, at least one of the plurality of first field dispersion layers may be in contact with the gate structure.

In some embodiments, the field dispersion layer may further include a second field dispersion layer. One end of the second field dispersion layer may be in contact with the plurality of first field dispersion layers and an other end of the second field dispersion layer may be in contact with the drain electrode.

In some embodiments, the field dispersion layer may include a mesh structure.

In some embodiments, a thickness of the field dispersion layer may be less than a thickness of the barrier layer.

In some embodiments, the gate structure may include a gate electrode, a first semiconductor layer, and a second semiconductor layer that may be sequentially arranged on the barrier layer.

In some embodiments, at least one material in the first semiconductor layer may be different than at least one material in the second semiconductor layer.

In some embodiments, the second semiconductor layer may be doped with the same type of a dopant as the first semiconductor layer.

In some embodiments, a host material of the second semiconductor layer may be the same as a host material of the field dispersion layer.

In some embodiments, a doping concentration of the second semiconductor layer may be the same as that of the field dispersion layer.

In some embodiments, a thickness of the second semiconductor layer may be the same as that of the field dispersion layer.

In some embodiments, the second semiconductor layer may be in contact with the source electrode.

In some embodiments, the field plate may include a conductive material.

In some embodiments, a partial area of the field plate may overlap the gate structure in a thickness direction of the channel layer.

In some embodiments, an etch stop layer may be between the barrier layer and the gate structure. The etch stop layer may be between the barrier layer and the field dispersion layer.

According to an embodiment, a high electron mobility transistor may include a channel layer; a barrier layer on the channel layer and configured to form a two-dimensional gas (2DEG) in the channel layer; a source electrode and a drain electrode spaced apart from each other and connected to a first end of the barrier layer and a second end of the barrier layer, respectively; a gate structure on a portion of the barrier layer between the first end of the barrier layer and the second end of the barrier layer; a field plate electrically connected to the source electrode and extending above the gate structure; and a field dispersion layer on the barrier layer between the gate structure and the drain electrode. The gate structure may be configured to form a depletion region in the 2DEG below the gate structure. The field dispersion layer may contact the drain electrode. The field dispersion layer may include a p-type doped semiconductor material.

In some embodiments, the channel layer may include $Al_xIn_yGa_{1-x-y}N$, where $0 \leq x \leq 1$, $0 \leq y \leq 1$, and $x+y \leq 1$. The barrier layer may include $Al_xIn_yGa_{1-x-y}N$, where $0 \leq x \leq 1$, $0 \leq y \leq 1$, and $x+y \leq 1$. The channel layer and the barrier layer may be different from each other in terms of at least one of polarization characteristics, energy bandgaps, and lattice constants.

In some embodiments, the gate structure may include a first semiconductor layer on the barrier layer, a second semiconductor layer on the first semiconductor layer, and a gate electrode on the second semiconductor layer. The first semiconductor layer and the second semiconductor layer may be different in terms of at least one of a doping concentration or a host material.

In some embodiments, an interval between the field plate and the field dispersion layer in a widthwise direction of the channel layer may be less than an interval between the gate structure and the drain electrode in the widthwise direction, or a portion of the field dispersion layer may overlap the field plate in a thickness direction of the channel layer.

In some embodiments, a thickness of the field dispersion layer may be less than a thickness of the barrier layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
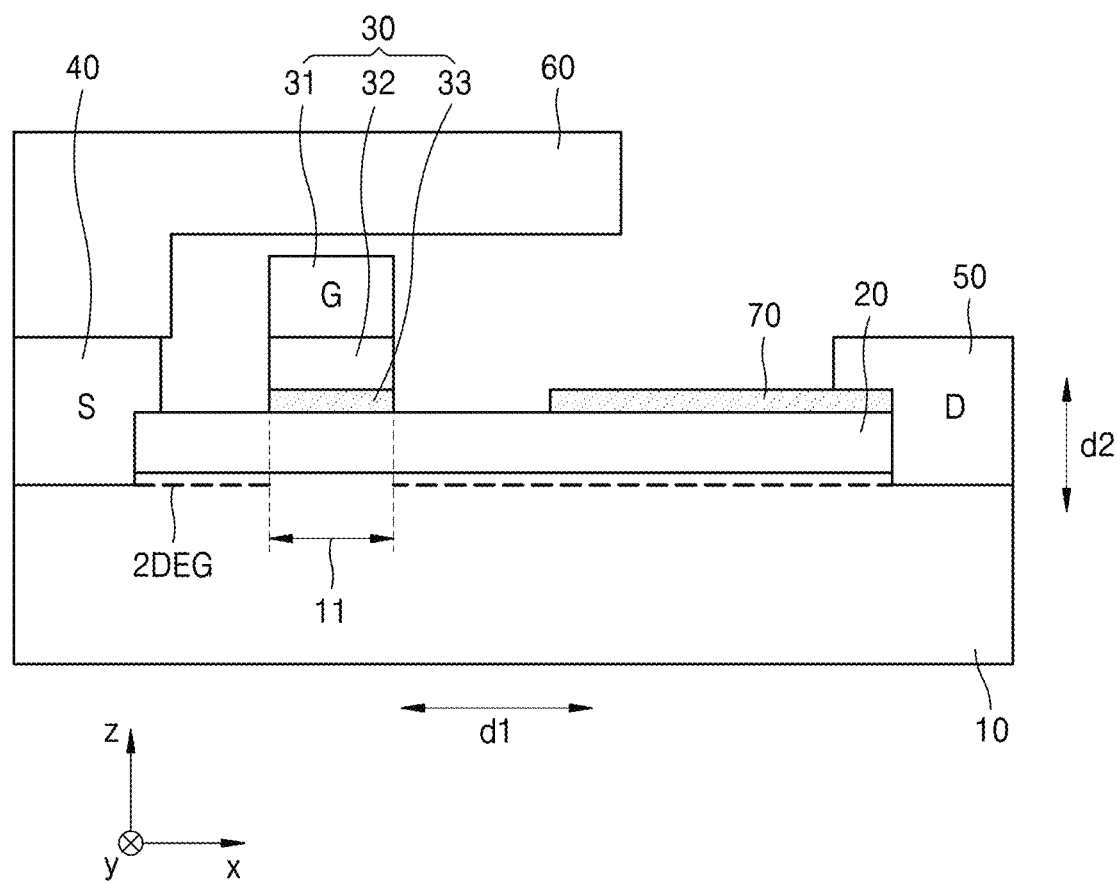
FIG. 1A is a cross-sectional view of a high electron mobility transistor (HEMT), according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In this regard, the present embodiments may have different forms and should not be construed as being limited to the descriptions set forth herein. Throughout the drawings, like reference numerals refer to like elements. The thickness or size of each layer illustrated in the drawings may be exaggerated for convenience of explanation and clarity.

In a layer structure, when a constituent element is disposed "above" or "on" to another constituent element, the constituent element may be only directly on the other constituent element or above the other constituent elements in a non-contact manner.

Terms such as "first" and "second" are used herein merely to describe a variety of constituent elements, but the constituent elements are not limited by the terms. Such terms are used only for the purpose of distinguishing one constituent element from another constituent element. The terms do not limit that the material or structure of the constituent elements are different from one another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components.

The use of the terms "a" and "an" and "the" and similar referents in the context of describing the disclosure are to be construed to cover both the singular and the plural.

When the terms "about" or "substantially" are used in this specification in connection with a numerical value, it is intended that the associated numerical value include a tolerance of +/−10% around the stated numerical value. When ranges are specified, the range includes all values therebetween such as increments of 0.1%.

Figure 1B:
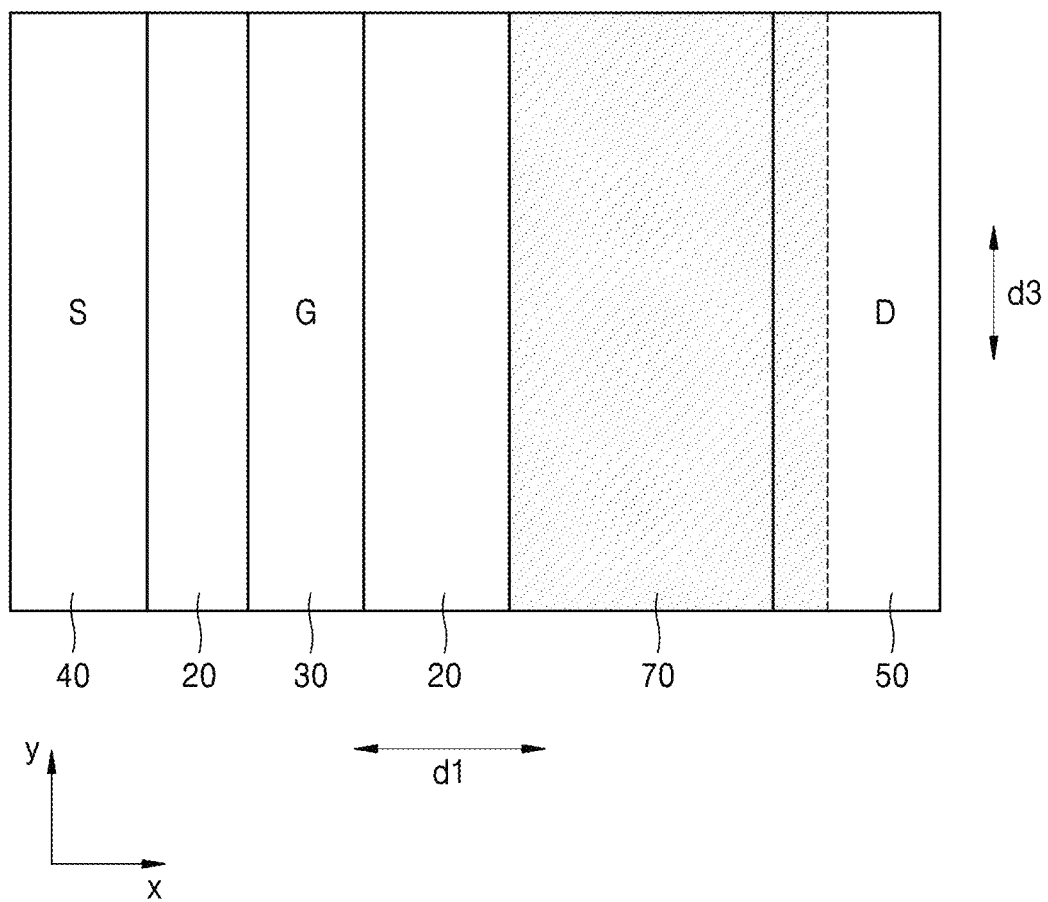
FIG. 1B is a plan view of the HEMT of FIG. 1A, except a field plate.

FIG. 1A is a cross-sectional view of a high electron mobility transistor (HEMT), according to an embodiment. FIG. 1B is a plan view of the HEMT of FIG. 1A, except a field plate 60. As illustrated in FIGS. 1A and 1B, the HEMT may include a channel layer 10, a barrier layer 20 arranged on the channel layer 10, a gate structure 30, a source electrode 40, and a drain electrode 50 spaced apart from each other on the barrier layer 20. Furthermore, the HEMT may be electrically connected to the source electrode 40, and may further include a field plate 60 extending over the gate structure 30 and a field dispersion layer 70 in contact with the barrier layer 20 and the drain electrode 50 and extending toward the gate structure 30.

The channel layer 10 may form a path for flowing a current between the source electrode 40 and the drain electrode 50. The channel layer 10 may have a single layer structure or a multilayer structure including one or more materials selected from nitrides including at least one group III-V materials, for example Al, Ga, or In. The channel layer 10 may include $Al_xIn_yGa_{1-x-y}N$ ($0 \leq x \leq 1$, $0 \leq y \leq 1$, and $x+y \leq 1$). For example, the channel layer 10 may include at least one of AlN, GaN, InN, InGaN or AlGaN, AlInN, AlInGaN, or the like. The channel layer 10 may be an undoped layer or a layer doped with a dopant. The channel layer 10 may have a thickness of several hundred nanometers or less (e.g., 700 nm or less, 500 nm or less, 300 nm or less).

The barrier layer 20 may be arranged on the channel layer 10. The barrier layer 20 may include a material different from the channel layer 10. The barrier layer 20 may form a two-dimensional electron gas (2DEG) in the channel layer 10. For example, the 2DEG may be an additional channel of a semiconductor device 10. The 2DEG may be formed adjacent to an interface between the channel layer 10 and the barrier layer 20. For example, the 2DEG may extend in a direction parallel to an upper surface of the channel layer 10.

The barrier layer 20 may be different from the channel layer 10 in terms of at least one of polarization characteristics, an energy bandgap, or a lattice constant. The barrier layer 20 may include one or more materials selected from nitrides including at least one of Al, Ga, or In. The barrier layer 20 may include $Al_xIn_yGa_{1-x-y}N$ ($0 \leq x \leq 1$, $0 \leq y \leq 1$, and $x+y \leq 1$). For example, the barrier layer 20 may include at least one of AlGaN, AlInN, InGaN, AlN, or AlInGaN. The barrier layer 20 may have a single layer structure or a multilayer structure.

The barrier layer 20 may be doped with a dopant diffused from an adjacent other layer, for example, the field dispersion layer 70 and a second semiconductor layer 33 that are described below.

When the barrier layer 20 is formed on the channel layer 10, the 2DEG may be induced in the channel layer 10 due to not only voluntary polarization, but also piezo polarization caused by a lattice constant difference between the channel layer 10 and the barrier layer 20. The 2DEG exhibits very high electron mobility.

The source electrode 40 and the drain electrode 50 may be arranged on the barrier layer 20. The source electrode 40 and the drain electrode 50 may be arranged apart from each other.

The source electrode 40 and the drain electrode 50 may be electrically connected to the 2DEG. For example, the source electrode 40 and the drain electrode 50 may extend to the inside of the channel layer 10 to be in direct contact with the 2DEG. The source electrode 40 and the drain electrode 50 may be in ohmic contact with the barrier layer 20.

The source electrode 40 and the drain electrode 50 may have a single layer structure or a multilayer structure. The source electrode 40 and the drain electrode 50 may each include an electrically conductive material, for example, a metal material and/or a metal alloy.

The gate structure 30 may be arranged on the barrier layer 20 between the source electrode 40 and the drain electrode 50. The gate structure 30 may be arranged closer to the source electrode 40 than to the drain electrode 50. The gate structure 30 may include a gate electrode 31, a first semiconductor layer 32, and the second semiconductor layer 33.

The gate electrode 31 may control a current flowing between the source electrode 40 and the drain electrode 50. The gate electrode 31 may include an electrically conductive material, for example, a metal material and/or a metal alloy.

The first semiconductor layer 32 may include a p-type semiconductor to form a depletion region 11 in the 2DEG formed in the channel layer 10. Accordingly, the 2DEG may not be formed in an area corresponding to the first semiconductor layer 32, or may have a different characteristic (electron concentration and the like) from the other area.

The first semiconductor layer 32 may implement normally-off characteristics of the HEMT. The normally-off characteristics may mean that, when no voltage is applied to the gate electrode 31, that is, in a normal state, the HEMT enters an OFF state, and when a voltage is applied to the gate electrode 31, the HEMT enters an ON state.

The first semiconductor layer 32 may include a semiconductor material doped with a p-type dopant. The first semiconductor layer 32 may include one or more materials selected from nitrides including at least one of group III-V materials, for example Al, Ga, or In, and the first semiconductor layer 32 may include $Al_xIn_yGa_{1-x-y}N$ ($0 \leq x \leq 1$, $0 \leq y \leq 1$, and $x+y \leq 1$). The first semiconductor layer 32 may include at least one of GaN, InN, AlGaN, AlInN, InGaN, AlN, AlInGaN, or the like. For example, the first semiconductor layer 32 may include a p-type GaN.

The first semiconductor layer 32 may have a thickness of about 10 nm to about 150 nm. When the thickness of the first semiconductor layer 32 is less than 10 nm, a sufficient amount of p-type impurities may not be included enough to form the depletion region 11 in the channel layer 10; consequently, the normally-on characteristics, in which a current flows in an OFF state, may occur. When the thickness of the first semiconductor layer 32 exceeds 150 nm, as the energy band level of the barrier layer 20 in a gate area GTA may be too high to set the HEMT to be an ON state, a bias voltage applied to the gate electrode 31 may be overly increased.

The first semiconductor layer 32 has a shape corresponding to the gate electrode 31. To this end, the first semiconductor layer 32 may be patterned in various methods. In an example, the first semiconductor layer 32 may optionally remove the remaining area except for a gate formation area, using an etching process. Dry etching may be used as an example of the etching process, and a chlorine ($Cl_2$) gas and/or a chloride boron ($BCl_3$) gas may be used as an example of the etching gas. Accordingly, the first semiconductor layer 32 is formed below the gate electrode 31, not at the side portion of the gate electrode 31.

The second semiconductor layer 33 may be arranged between the barrier layer 20 and the first semiconductor layer 32. The second semiconductor layer 33 may have a different energy bandgap from the first semiconductor layer 32.

The second semiconductor layer 33 may be different from the first semiconductor layer 32 in terms of at least one of a doping concentration or a host material. The second semiconductor layer 33 may include a group III-V material, but may be different from the first semiconductor layer 32 in terms of at least one material. The second semiconductor layer 33 may include $Al_xIn_yGa_{1-x-y}N$ (0≤x≤1, 0≤y≤1, and x+y≤1). The second semiconductor layer 33 may include at least one of GaN, InN, AlGaN, AlInN, InGaN, AlN, AlInGaN, or the like. For example, when the first semiconductor layer 32 includes a GaN material, the second semiconductor layer 33 may include an AlGaN material.

The second semiconductor layer 33 may be doped with a dopant. The dopant may include a p-type dopant that provides holes. For example, the dopant may include magnesium (Mg).

The second semiconductor layer 33 may have a different doping concentration from the first semiconductor layer 32. For example, the second semiconductor layer 33 may have a doping concentration lower than that of the first semiconductor layer 32. The doping concentration of the second semiconductor layer 33 may be 1% to 50% of the doping concentration of the first semiconductor layer 32.

The second semiconductor layer 33 may have a thickness that does not affect the depletion region 11 formed by the first semiconductor layer 32. The thickness of the second semiconductor layer 33 may be less than the thicknesses of the barrier layer 20 and the first semiconductor layer 32. For example, the second semiconductor layer 33 may have a thickness of about 10 nm or less.

As the channel layer 10 and the barrier layer 20 are different from each other in terms of a lattice constant, an energy bandgap, and the like, a defect may occur in the interface between the channel layer 10 and the barrier layer 20. As the operation of the HEMT is repeated, stress may be generated due to the above defect, and the stress may increase the on-resistance of the HEMT.

Figure 2A:
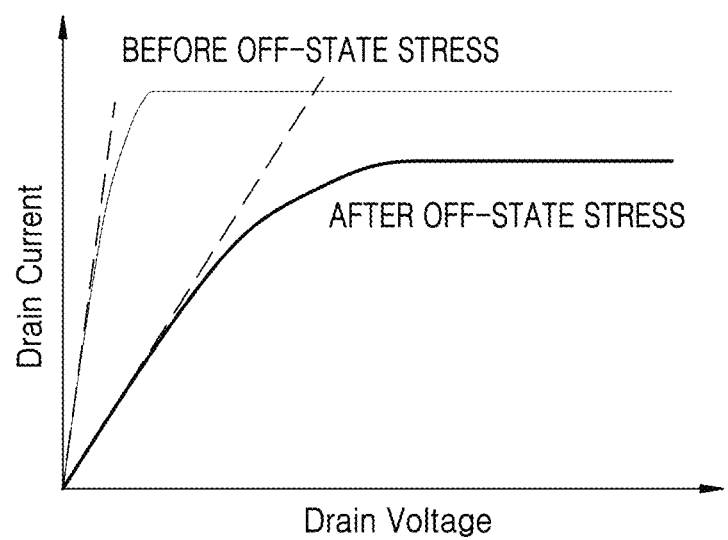
FIG. 2A is a graph showing IV characteristics in the HEMT before and after stress.
Figure 2B:
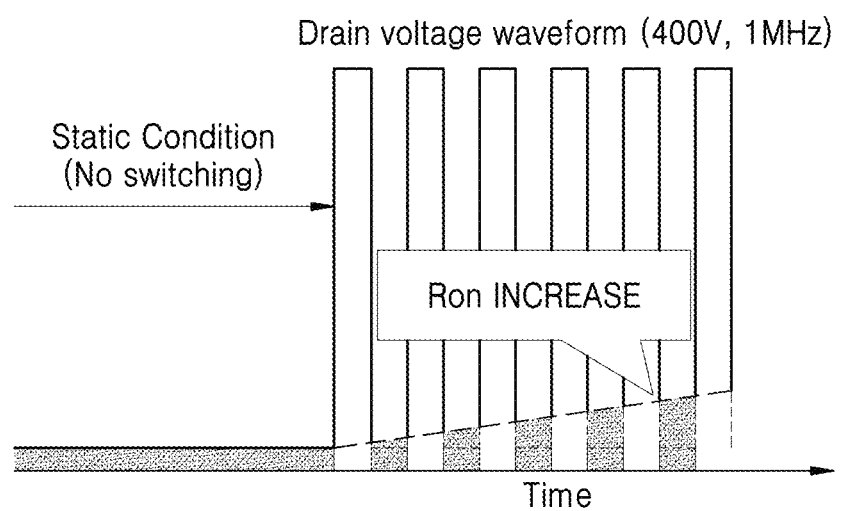
FIG. 2B is a graph showing a result of measuring a dynamic-on resistance during an HEMT operation.

FIG. 2A is a graph showing IV characteristics in the HEMT before and after stress. FIG. 2B is a graph showing a result of measuring a dynamic-on resistance during an HEMT operation. As illustrated in FIG. 2A, when stress is generated in the interface between the channel layer 10 and the barrier layer 20, it may be seen that a current flowing in the drain electrode due to a voltage applied to the drain electrode decreases. This means that on resistance increases in the channel layer 10. As illustrated in FIG. 2B, due to a repeated operation of the HEMT, the on resistance may gradually increase. This is because an electronic trap may increase in the interface between the channel layer 10 and the barrier layer 20, and consequently, a current collapse phenomenon may be generated.

The HEMT according to an embodiment may further include the field plate 60 and the field dispersion layer 70 to limit and/or prevent an increase of the on resistance.

The field plate 60 may extend from the source electrode 40 above the gate structure 30. The field plate 60 may be electrically connected to the source electrode 40. For example, the field plate 60 may be in direct contact with the source electrode 40. Accordingly, the source electrode 40 and the field plate 60 may have the same electric potential. As the field plate 60 extends from the source electrode 40 above the gate structure 30, a partial area of the field plate 60 may overlap the gate structure 30 in a thickness direction d2 of the channel layer 10. An interval between the field plate 60 and the drain electrode 50 in a widthwise direction d1 of the channel layer 10 may be less than an interval between the gate structure 30 and the drain electrode 50.

The field plate 60 may include an electrically conductive material. For example, the field plate 60 may include a metal or metal alloy, and may include the same material as the source electrode 40. The field plate 60 with the field dispersion layer 70 described below may limit and/or prevent concentration of an electric field on the channel layer 10 due to a voltage difference between the source electrode 40 and the drain electrode 50.

The field dispersion layer 70 may be in direct contact with the barrier layer 20 and the drain electrode 50, and may be arranged to face the gate structure 30 from the drain electrode 50. In the widthwise direction d1 of the channel layer 10, an interval between the field dispersion layer 70 and the field plate 60 may be less than an interval between the field dispersion layer 70 and the gate electrode 31. The field dispersion layer 70 may partially overlap the field plate 60 in the thickness direction d2 of the channel layer 10. When a portion of the field plate 60 overlaps a portion of the field dispersion layer 70, in the thickness direction d2 of the channel layer 10, the interval between the field dispersion layer 70 and the field plate 60 may be said to be 0. However, the disclosure is not limited thereto. In some embodiments, in the thickness direction d2 of the channel layer 10, the portion of the field dispersion layer 70 may not overlap the field plate 60.

The field dispersion layer 70 may include one or more materials selected from nitrides including at least one of group III-V materials, for example Al, Ga, or In. The field dispersion layer 70 may include $Al_xIn_yGa_{1-x-y}N$ (0≤x≤1, 0≤y≤1, and x+y≤1). The field dispersion layer 70 may include at least one of GaN, InN, AlGaN, AlInN, InGaN, AlN, AlInGaN, or the like.

The field dispersion layer 70 may be doped with a dopant to improve electrical characteristics. For example, the doping concentration of the field dispersion layer 70 may be greater than the doping concentration of the barrier layer 20. The field dispersion layer 70 may be doped with a p-type dopant.

When a large amount of a dopant is doped in the field dispersion layer 70, like the first semiconductor layer 32, the 2DEG may be depleted. Accordingly, the field dispersion layer 70 may need to have a thickness and a doping concentration, by which the 2DEG under the field dispersion layer 70 is not depleted, and the field dispersion layer 70 may include a material having a similar bandgap to the barrier layer 20, and may be formed to help forming the 2DEG, like the barrier layer 20.

In this state, the doping concentration of the field dispersion layer 70 may be at a concentration level of 1% to 50% of the doping concentration of the first semiconductor layer 32, and a thickness of the field dispersion layer 70 may be less than 10 nm.

When the field dispersion layer 70 is not configured to cover the whole of the barrier layer 20, the thickness and doping concentration of the field dispersion layer 70 may be increased further. This is because, even when the 2DEG under the field dispersion layer 70 is slightly depleted by the field dispersion layer 70, the on resistance may be secured using the 2DEG in an area that is not covered by the barrier layer 70.

A partial area of the barrier layer 20 may not overlap the field dispersion layer 70. For example, one end of the field dispersion layer 70 may be in direct contact with the drain electrode 50, and the other end thereof may be arranged apart from the gate structure 30.

In an OFF state, the voltage applied to the source electrode 40 may be distributed to the field plate 60, and the voltage applied to the drain electrode 50 may be distributed to the field dispersion layer 70. While an electric field is formed in the channel layer 10 between the source electrode 40 and the drain electrode 50 due to a voltage difference between the source electrode 40 and the drain electrode 50, an electric field may be formed between the field plate 60 and the field dispersion layer 70. Accordingly, a concentration of an electric field on the channel layer 10 may be reduced or alleviated.

Furthermore, as the field dispersion layer 70 is doped with a p-type dopant, in an ON state, the hole injection efficiency of the channel layer 10 and/or the barrier layer 20 may be improved. As the hole injection efficiency improves, the concentration of the 2DEG of the channel layer 10 may increase and accordingly the on resistance of the channel layer 10 may be reduced. This is because the electronic trap may be reduced by providing holes to the interface of the barrier layer 20 and the channel layer 10.

The thickness of the field dispersion layer 70 may be less than the thickness of the drain electrode 50. The thickness of the field dispersion layer 70 may be less than the thickness of the barrier layer 20. For example, the thickness of the field dispersion layer 70 may be ½ or less than the thickness of the barrier layer 20. The thickness of the field dispersion layer 70 may be about 10 nm or less.

The thickness of the field dispersion layer 70 may be equal to the thickness of the second semiconductor layer 33. This is because the field dispersion layer 70 and the second semiconductor layer 33 may be epitaxially grown. Furthermore, a host material of the field dispersion layer 70 may be the same as a host material of the second semiconductor layer 33, and the doping concentration of the field dispersion layer 70 may be the same as or different from the doping concentration of the second semiconductor layer 33. The field dispersion layer 70 may disperse an electric field in an OFF state, and may increase the hole injection efficiency in an ON state.

The field dispersion layer 70 is illustrated as a single layer, but the disclosure is not limited thereto. In some embodiments, the field dispersion layer 70 may include a plurality of layers.

Figure 3:
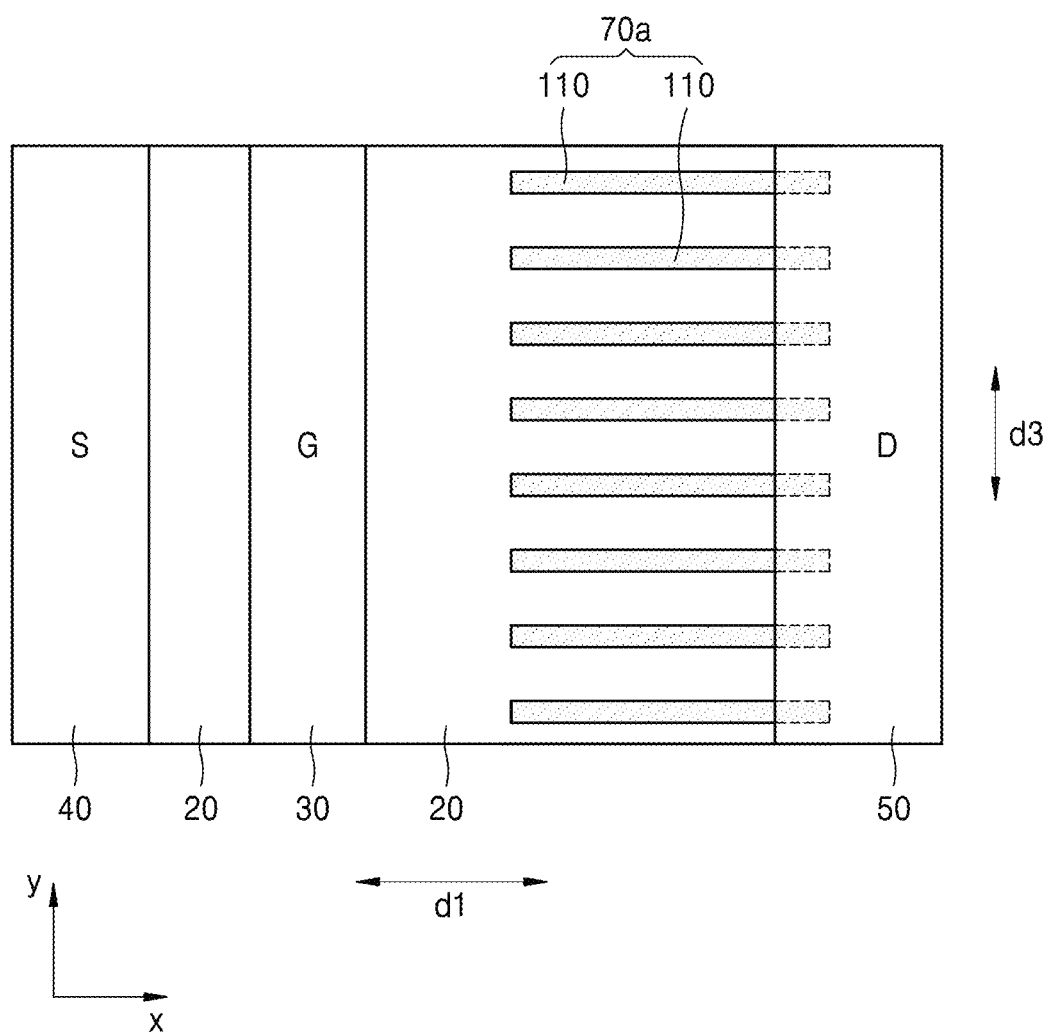
FIG. 3 is a view of a field dispersion layer including a plurality of layers, according to an embodiment.

FIG. 3 is a view of a field dispersion layer 70a including a plurality of layers, according to an embodiment. As illustrated in FIG. 3, the field dispersion layer 70a may include a plurality of first field dispersion layers 110 that are spaced apart from each other on the barrier layer 20. The first field dispersion layers 110 may be sequentially arranged in a direction crossing the widthwise direction d1 of the channel layer 10. For example, the first field dispersion layers 110 may be sequentially arranged in a direction d3 perpendicular to the widthwise direction d1 of the channel layer 10.

One end of each of the first field dispersion layers 110 may be in contact with the drain electrode 50, and the other end thereof may be arranged apart from the gate structure 30. The first field dispersion layers 110 may have a bar shape, but the disclosure is not limited thereto. As the field dispersion layer 70a includes first field dispersion layers 110 that are arranged spaced apart from each other, an area of the barrier layer 20 overlapping the field dispersion layer 70a may be reduced. As the area of the barrier layer 20 overlapping the field dispersion layer 70a decreases, the effect of the field dispersion layer 70a on the 2DEG may be reduced.

Figure 4:
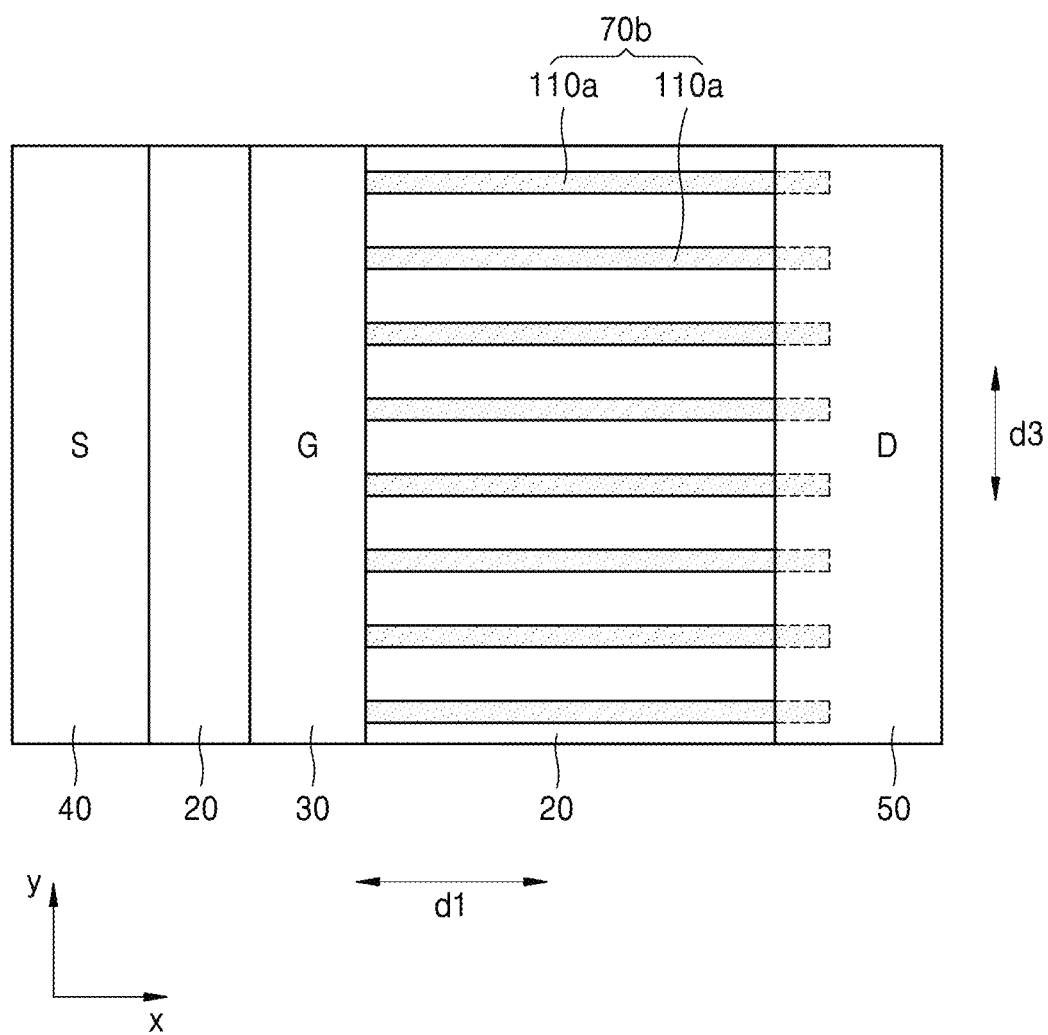
FIG. 4 is a view of a field dispersion layer including a plurality of layers, according to another embodiment.

FIG. 4 is a view of a field dispersion layer 70b including a plurality of layers, according to another embodiment. When comparing FIG. 3 with FIG. 4, at least one of a plurality of first field dispersion layers 110a may be in contact with the gate structure 30. For example, at least one of the first field dispersion layers 110a may be in contact with the second semiconductor layer 33 of the gate structure 30.

The field dispersion layer 70b may have the same height as the second semiconductor layer 33, and may include the same host material as the second semiconductor layer 33. The field dispersion layer 70b may not only distribute an electric field with the field plate 60, but also increase the hole injection efficiency like the second semiconductor layer 33. Accordingly, an increase of the on resistance may be reduced.

Figure 5:
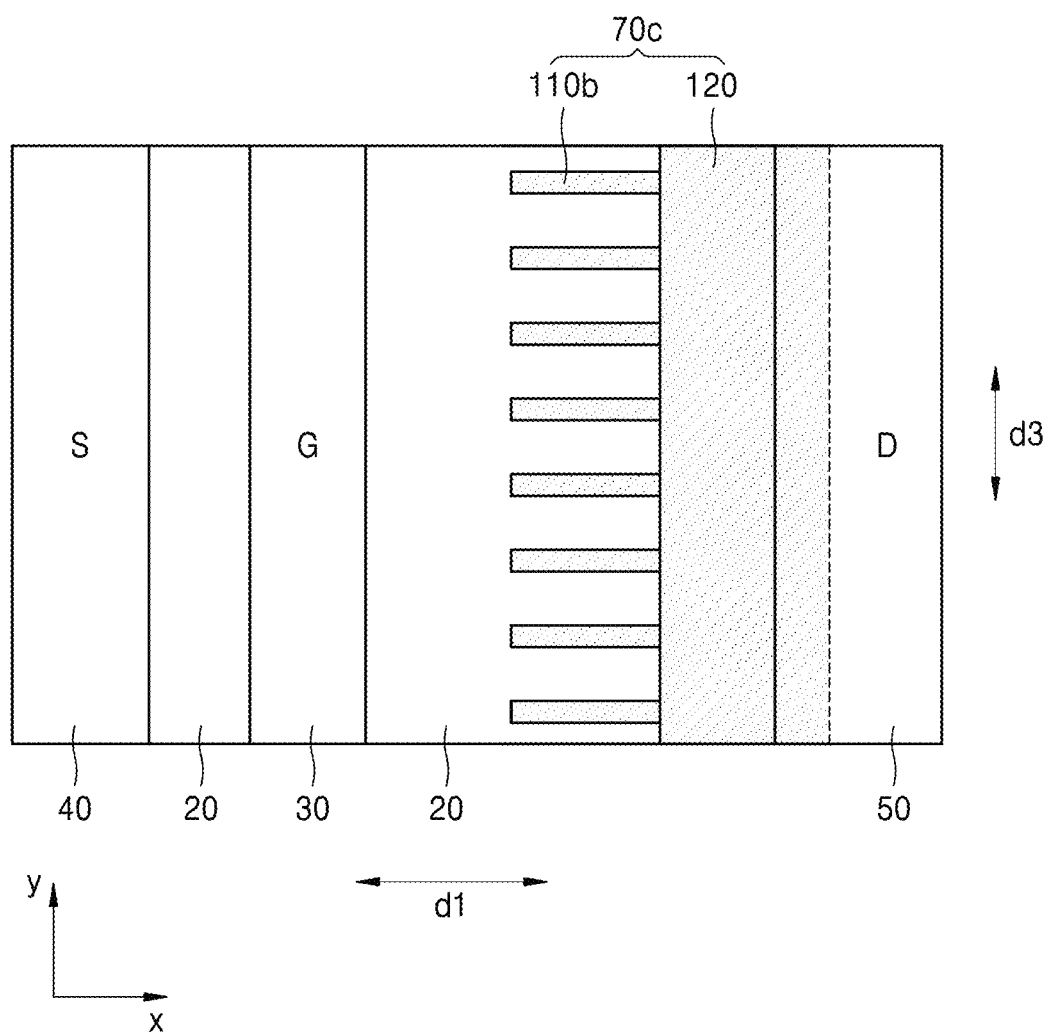
FIG. 5 is a view of a field dispersion layer including a plurality of layers, according to another embodiment.

FIG. 5 is a view of a field dispersion layer 70c including a plurality of layers, according to another embodiment. As illustrated in FIG. 5, the field dispersion layer 70c may include a plurality of first field dispersion layers 110b arranged spaced apart from each other on the barrier layer 20, and a second field dispersion layer 120 having one end in contact with the first field dispersion layers 110b and the other end in contact with the drain electrode 50.

The first field dispersion layers 110b may be sequentially arranged in a direction crossing the widthwise direction d1 of the channel layer 10. For example, the first field dispersion layers 110b may be sequentially arranged in the direction d3 perpendicular to the widthwise direction d1 of the channel layer 10 on the drain electrode 50. The length of the second field dispersion layer 120 may correspond to the length of the drain electrode 50. The second field dispersion layer 120 may reinforce a contact with the drain electrode 50, and the first field dispersion layers 110b may reduce an effect on the 2DEG.

Figure 6:
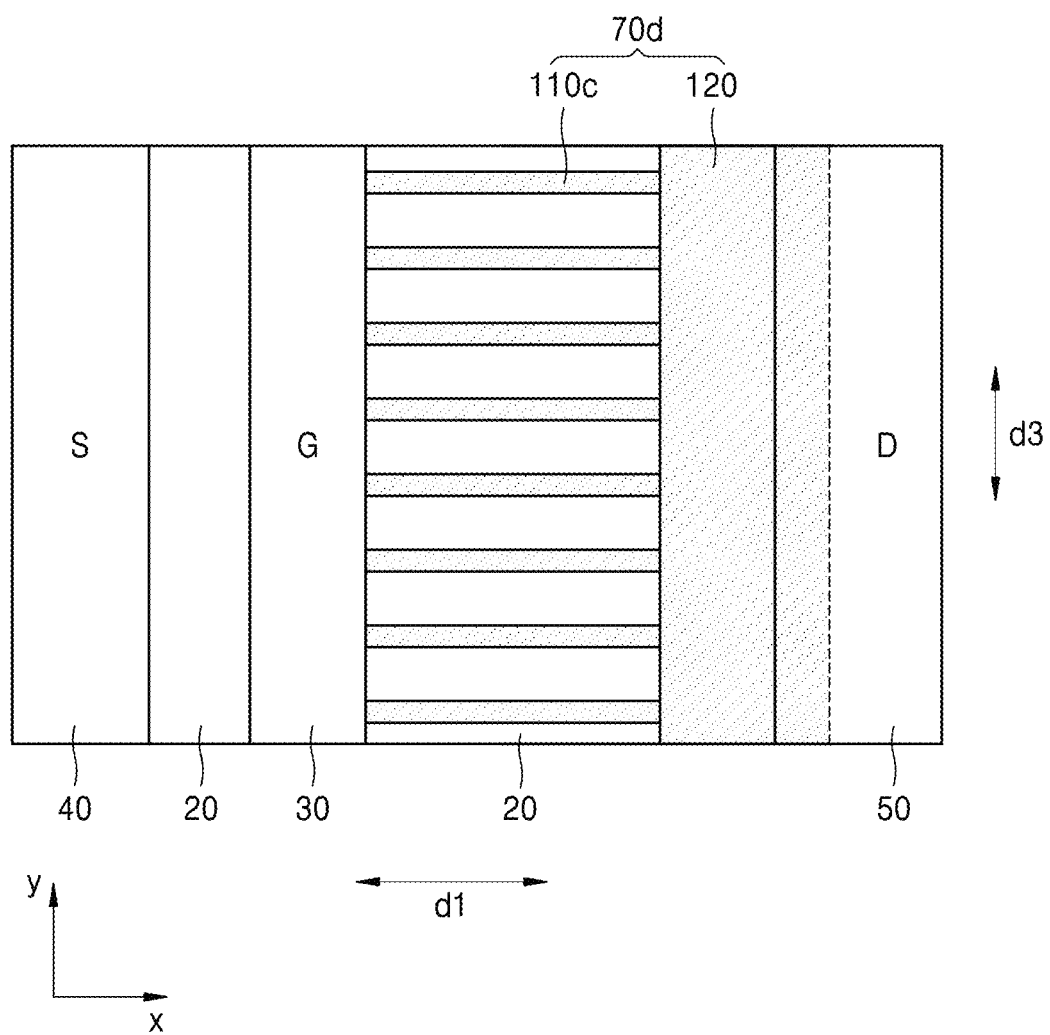
FIG. 6 is a view of a field dispersion layer including a plurality of layers, according to another embodiment.

FIG. 6 is a view of a field dispersion layer 70d including a plurality of layers, according to another embodiment. When comparing FIG. 5 with FIG. 6, at least one of a plurality of first field dispersion layers 110c may be in contact with the gate structure 30. For example, at least one of the first field dispersion layers 110c may be in contact with the second semiconductor layer 33 of the gate structure 30.

The field dispersion layer 70d may have the same thickness as the second semiconductor layer 33, and include the same host material as the second semiconductor layer 33. The field dispersion layer 70d may be doped with a p-type dopant like the second semiconductor layer 33, thereby having a carrier generation effect. Accordingly, an increase of the on resistance may be reduced.

Figure 7:
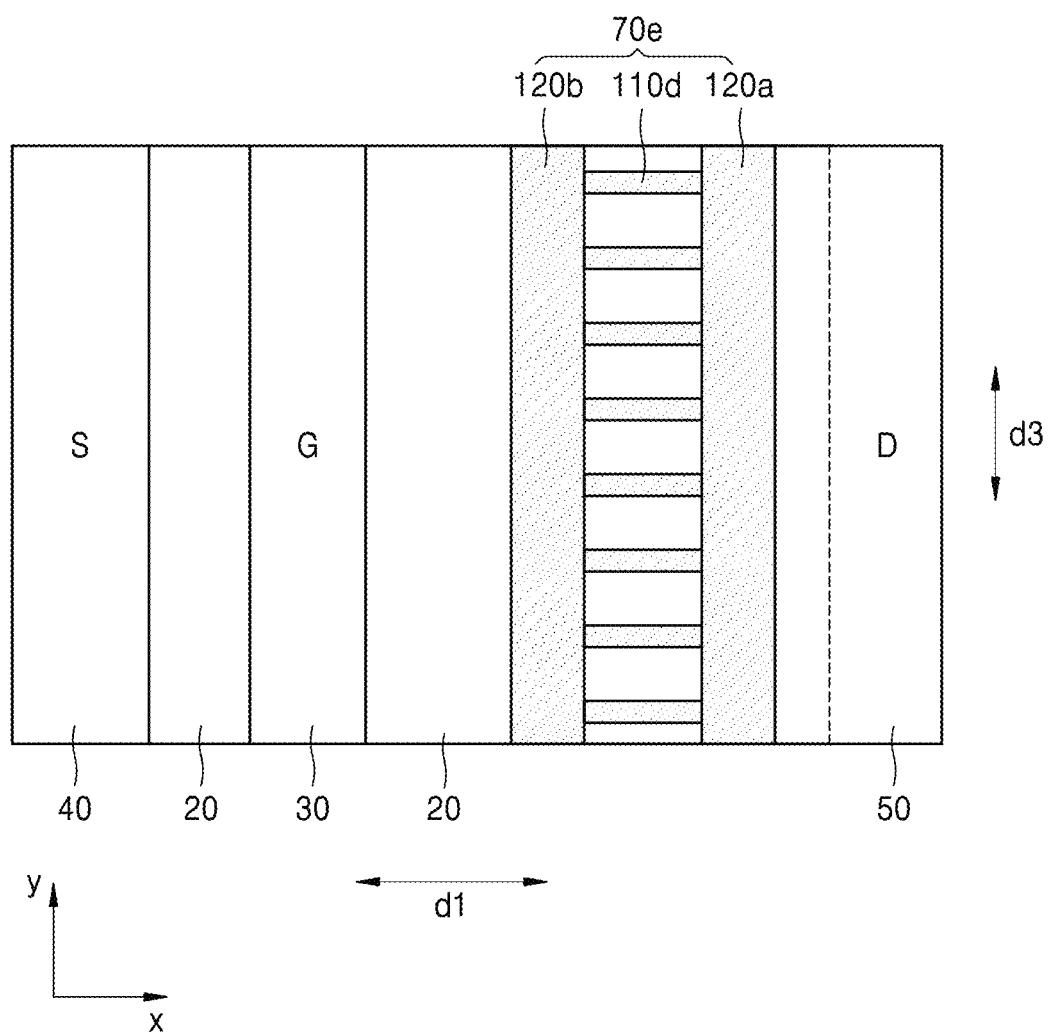
FIG. 7 is a view of a field dispersion layer having a mesh structure, according to an embodiment.

FIG. 7 is a view of a field dispersion layer 70e having a mesh structure, according to an embodiment. As illustrated in FIG. 7, the field dispersion layer 70e may include a mesh structure having one or more openings for exposing the barrier layer 20. For example, the field dispersion layer 70e may include a plurality of first field dispersion layers 110d arranged spaced apart from the barrier layer 20, a second field dispersion layer 120a having one end in contact with the first field dispersion layers 110d and the other end in contact with the drain electrode 50, and a third field dispersion layer 120b having one end in contact with the first field dispersion layers 110d and the other end arranged spaced apart from the gate structure 30.

The length of the second field dispersion layer 120a may correspond to the length of the drain electrode 50. A contact with the drain electrode 50 may be reinforced by the second field dispersion layer 120a, and an increase of the on resistance may be reduced by the second field dispersion layer 120a.

The length of the third field dispersion layer 120b may correspond to the length of the field plate 60, and the third field dispersion layer 120*b* may overlap the field plate 60 in the thickness direction d2 of the channel layer 10. The third field dispersion layer 120*b* may entirely overlap the field plate 60 in the thickness direction d2 of the channel layer 10. Accordingly, as the third field dispersion layer 120*b* increases an overlapping area between the field dispersion layer 70 and the field plate 60, the concentration of an electric field may be further reduced.

Figure 8:
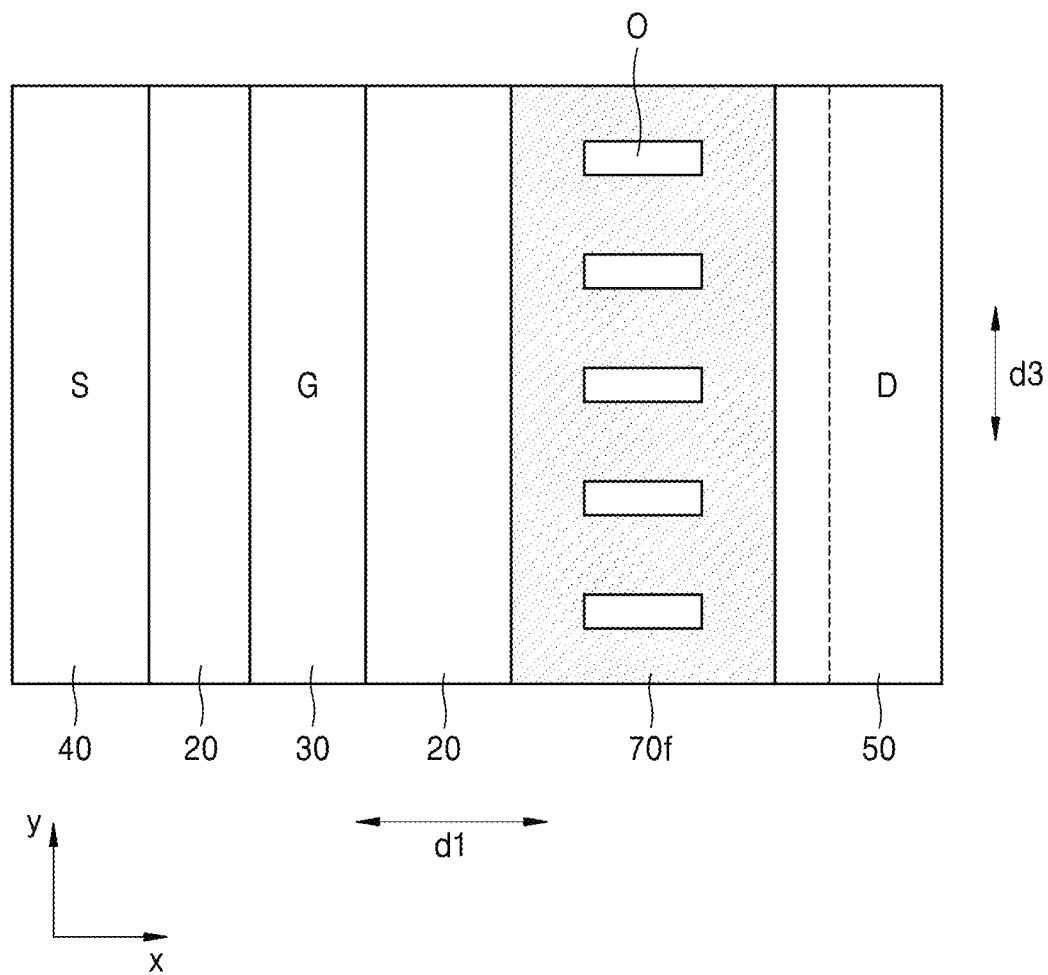
FIG. 8 is a view of a field dispersion layer having a pattern, according to an embodiment.

FIG. 8 is a view of a field dispersion layer having a pattern, according to an embodiment.

As illustrated in FIG. 8, the field dispersion layer 70*f* may be patterned. For example, the field dispersion layer 70*f* may include a pattern defining a plurality of openings O that extend through the field dispersion layer 70*f* in a thickness direction. The openings O may expose an underlying layer, such as the barrier layer 20 or the etch stop layer 80 discussed in relation to FIG. 10.

While the field dispersion layer 70*f* in FIG. 8 includes a plurality of rectangular opening O spaced apart from each other in a direction d3 crossing the widthwise direction d1, example embodiments are not limited thereto. The openings O alternatively may have other shapes (e.g., circular shape) and alternatively may be arranged in an array or other pattern.

Figure 9:
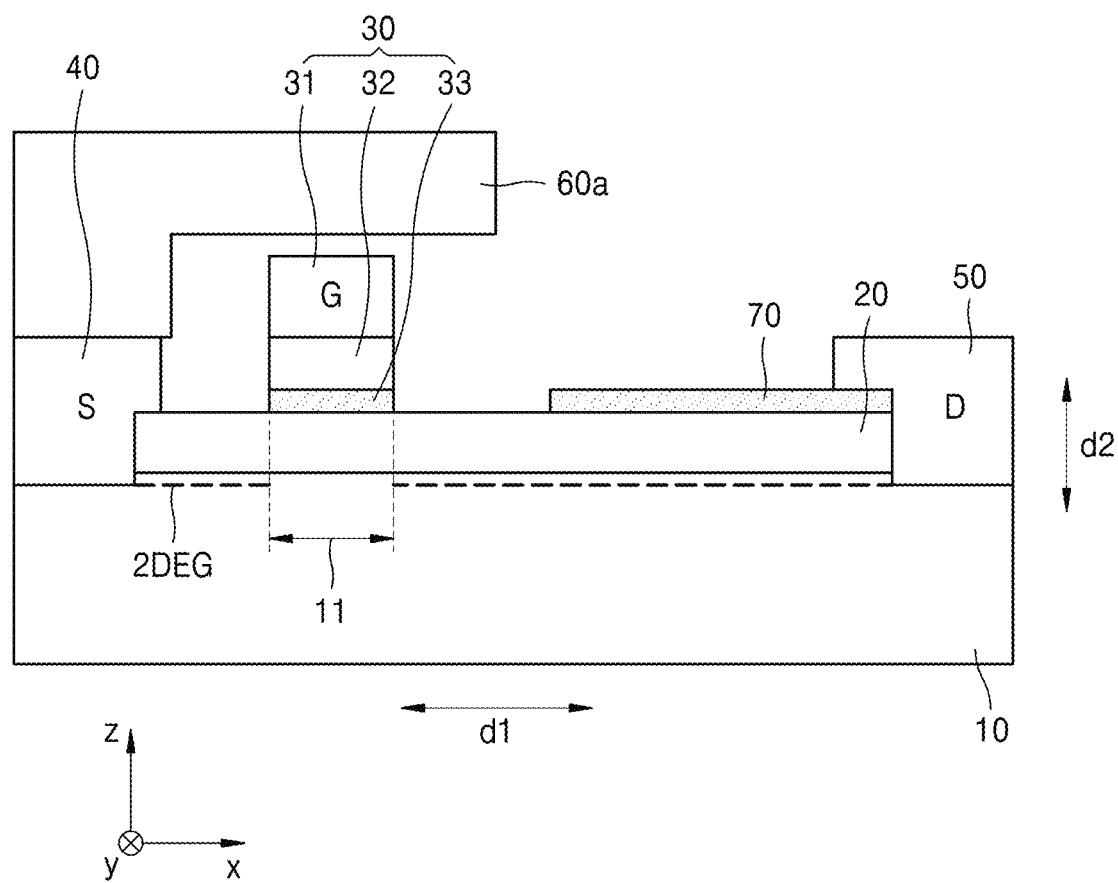
FIG. 9 is a cross-sectional view of an HEMT in which a field plate does not overlap a field dispersion layer, according to an embodiment.

FIG. 9 is a cross-sectional view of an HEMT in which a field plate 60*a* does not overlap the field dispersion layer 70, according to an embodiment. When comparing FIG. 1 with FIG. 9, the field plate 60*a* and the field dispersion layer 70 of FIG. 9 may not overlap each other in the thickness direction d2 of the channel layer 10. Even when the field plate 60*a* and the field dispersion layer 70 do not overlap each other, the interval between the field plate 60*a* and the field dispersion layer 70 may be less than the interval between the gate electrode 31 and the field dispersion layer 70 in the widthwise direction d1 of the channel layer 10. Furthermore, an average distance between the field plate 60*a* and the field dispersion layer 70 may be less than an average distance between the source electrode 40 and the drain electrode 50. Accordingly, in an OFF state, an electric field may be formed not only in the channel layer 10, but also in the field plate 60*a* and the field dispersion layer 70.

Figure 10:
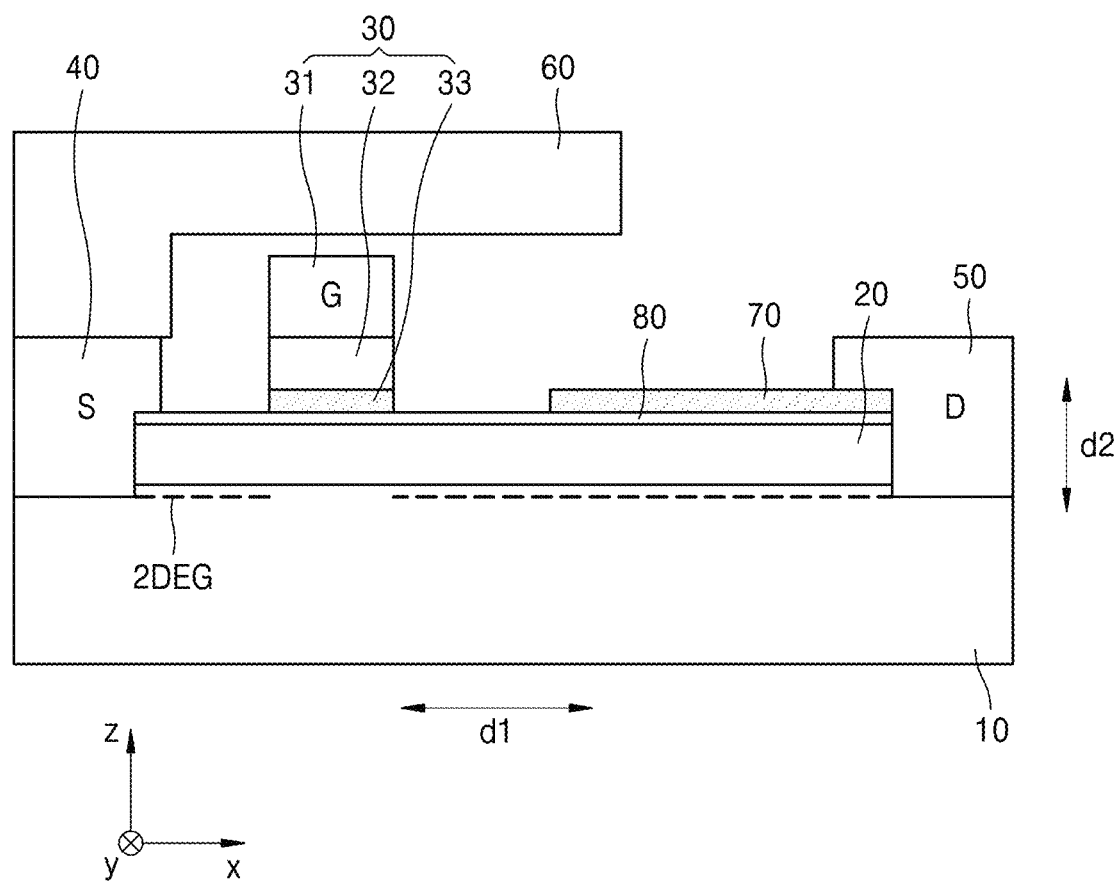
FIG. 10 is a cross-sectional view of an HEMT including an etch stop layer, according to an embodiment.

The second semiconductor layers 33, and 33*a* and the field dispersion layers 70, 70*a*, 70*b*, 70*c*, 70*d*, 70*e*, and 70*f* may be formed on the barrier layer 20 through an etching process. The HEMT according to an embodiment may use an etch stop layer to limit and/or prevent damage of the barrier layer 20 during the etching process. FIG. 10 is a cross-sectional view of an HEMT including an etch stop layer 80, according to an embodiment.

As illustrated in FIG. 10, the etch stop layer 80 may be arranged on the barrier layer 20, and the second semiconductor layer 33 and the field dispersion layer 70 may be arranged on the etch stop layer 80. This is to limit and/or prevent unnecessary etching of the barrier layer 20 under the second semiconductor layer 33 and the field dispersion layer 70 when forming the second semiconductor layer 33 and the field dispersion layer 70. In an example, the etch stop layer 80 may include at least one of InGaN, AlGaN, and AlInGaN.

The excessive dopant infiltration into the channel layer 10 may degrade the characteristics of the 2DEG. When a dopant diffuses from the barrier layer 20 toward the channel layer 10, the dopant concentration of the channel layer 10 may be increased so that the characteristics of the 2DEG may degrade. Also, as the dopant concentration of the barrier layer 20 decreases, a desired threshold voltage or the on resistance may not be implemented.

Figure 11:
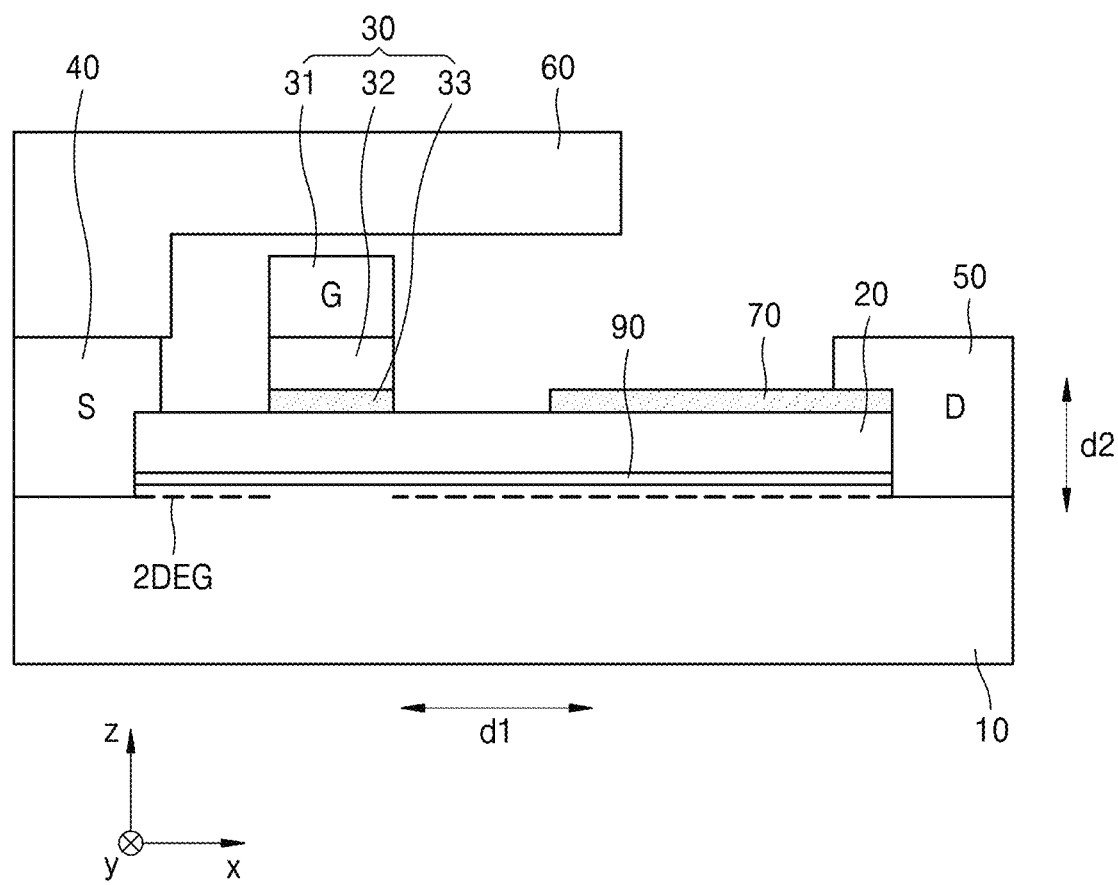
FIG. 11 is a cross-sectional view of an HEMT including a second barrier layer according to an embodiment.

FIG. 11 is a cross-sectional view of an HEMT including a second barrier layer 90, according to an embodiment. Referring to FIG. 11, another barrier, for example, a second barrier layer 90 for increasing a polarization phenomenon may be arranged between the channel layer 10 and the barrier layer 20. The second barrier layer 90 may include one or more materials selected from nitrides including at least one of group III-V materials, for example Al, Ga, or In. The second barrier layer 90 may be an undoped material layer. The second barrier layer 90 may include $Al_xIn_yGa_{1-x-y}N$ ($0 \le x \le 1$, $0 \le y \le 1$, and $x+y \le 1$) that is undoped. The second barrier layer 90 may include at least one of GaN, InN, AlGaN, AlInN, InGaN, AlN, AlInGaN, or the like.

The thickness of the second barrier layer 90 may be about 0.5 nm to about 1.5 nm. As the second barrier layer 90 increases a polarization phenomenon, the characteristics of the 2DEG may be improved.

Figure 12:
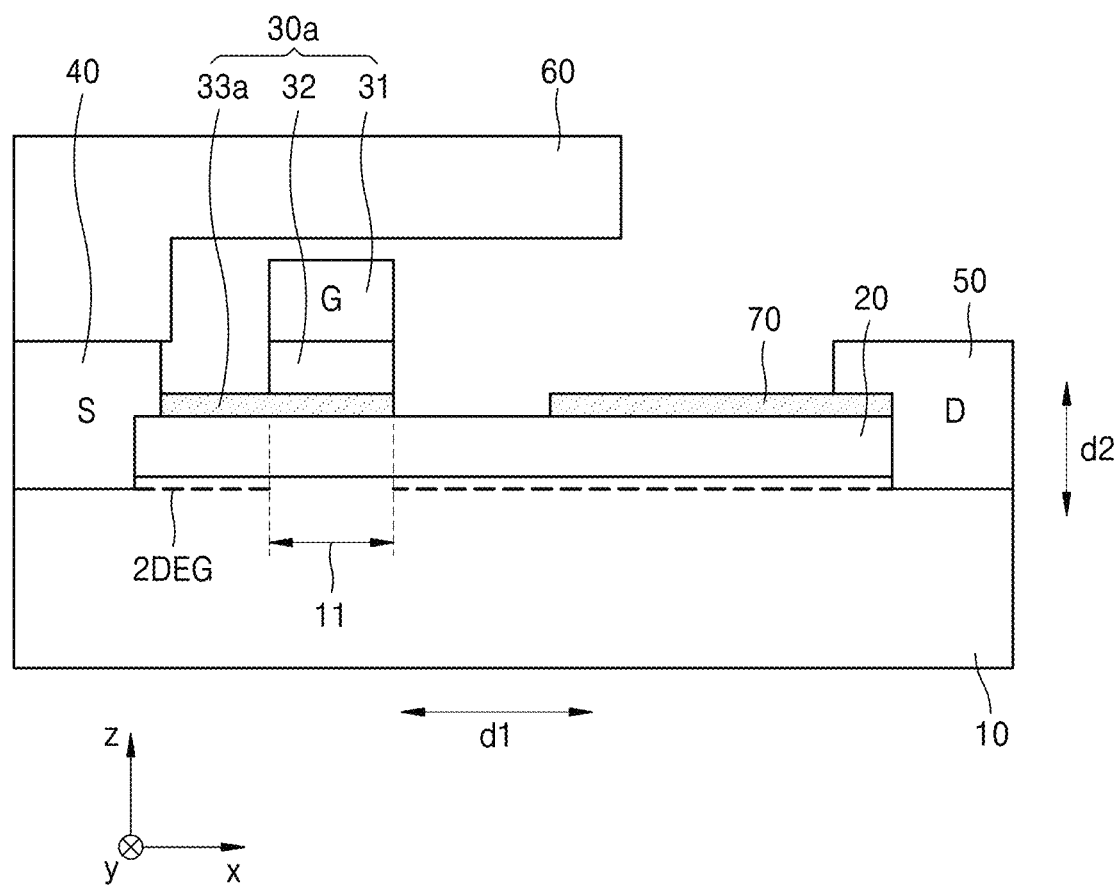
FIG. 12 is a cross-sectional view of an HEMT in which a second semiconductor layer is connected to a source, according to an embodiment.

FIG. 12 is a cross-sectional view of an HEMT in which a second semiconductor layer 33*a* is connected to a source, according to an embodiment. As the second semiconductor layer 33*a* is doped with a p-type dopant, holes are provided to the channel layer 10 and thus an electronic trap may be reduced. To limit and/or prevent excessive hole injection to the channel layer 10, the thickness of the second semiconductor layer 33*a* may be less than the thickness of the barrier layer 20. For example, the thickness of the second semiconductor layer 33*a* may be about 10 nm or less.

To provide holes to a larger area of the channel layer 10, the area of the second semiconductor layer 33*a* may be greater than the area of the gate electrode 31. The second semiconductor layer 33*a* may extend from the first semiconductor layer 32 toward at least one of the source electrode 40 and the drain electrode 50. For example, the second semiconductor layer 33*a* may extend toward the source electrode 40 so as to be in contact with the source electrode 40, and may be arranged spaced apart from the field dispersion layer 70.

In the gate structure 30*a*, the gate electrode 31 may have a same width in the widthwise direction d1 as the first semiconductor layer 32. Sidewalls of the gate electrode 31 and the first semiconductor layer 32 may be coplanar with each other. However, example embodiments are not limited thereto.

Figure 13:
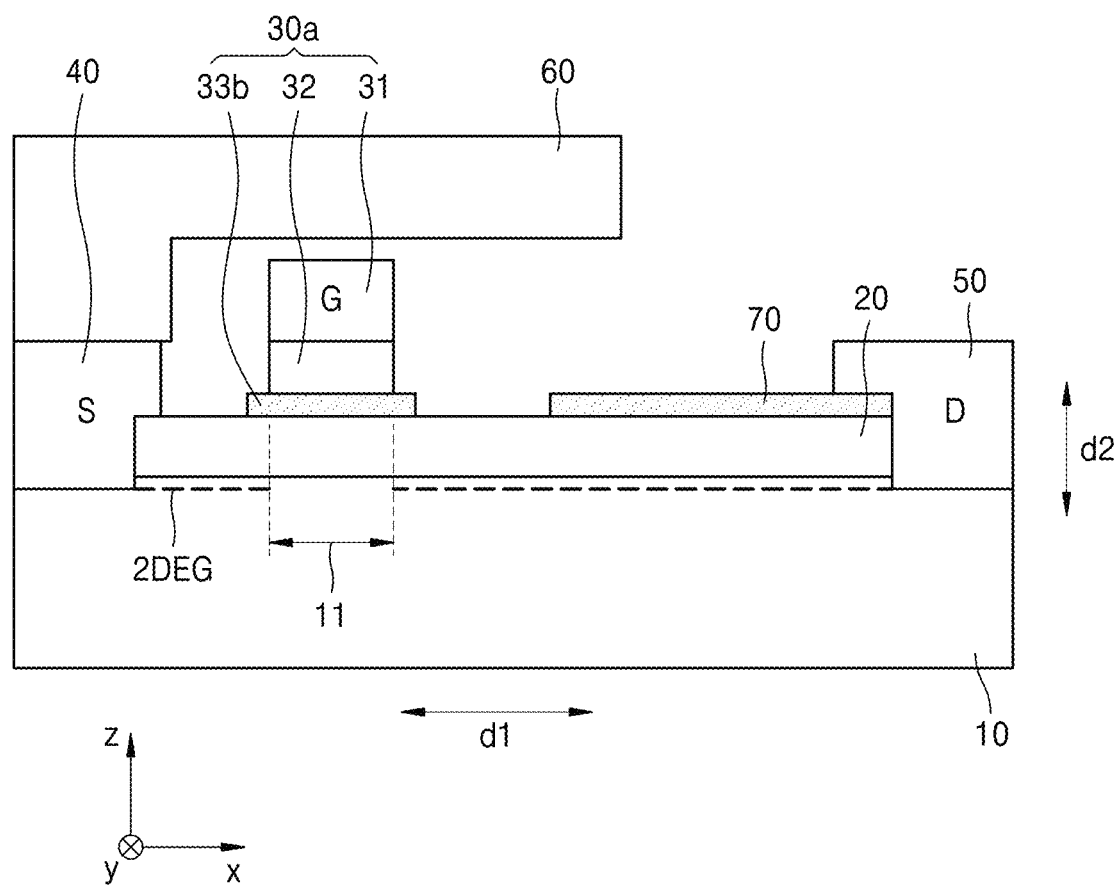
FIG. 13 is a cross-sectional view of an HEMT in which a second semiconductor layer has a different width than a gate electrode, according to an embodiment.

FIG. 13 is a cross-sectional view of an HEMT in which a second semiconductor layer has a different width than a gate electrode, according to an embodiment.

As illustrated in FIG. 13, the second semiconductor layer 33*b* may extend from a first side of the first semiconductor layer 32 toward the source electrode 40 and from a second side of the of the first semiconductor layer 32 toward the drain electrode 50. The second semiconductor layer 33*b* may be spaced apart from the field dispersion layer 70. While FIG. 13 illustrates the second semiconductor layer 33*b* spaced apart from the source electrode 40, example embodiments are not limited thereto and the second semiconductor layer 33*b* may contact the source electrode 40 in other embodiments.

The thickness of the second semiconductor layer 33*b* may be less than the thickness of the barrier layer 20. For example, the thickness of the second semiconductor layer 33*b* may be about 10 nm or less.

Figure 14:
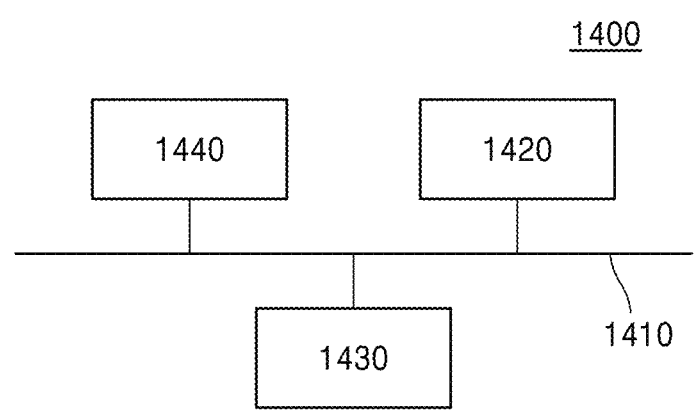
FIG. 14 is a schematic view of an electronic device including an HEMT according to an example embodiment.

FIG. 14 is a schematic view of an electronic device including an HEMT according to an example embodiment.

As shown in FIG. 14, the electronic device 1400 includes one or more electronic device components, including a processor (e.g., processing circuitry) 1420 and a memory 1430 that are communicatively coupled together via a bus 1410.

The processing circuitry 1420 may include, and/or may be implemented by, one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 may include one or more additional components 1440, coupled to bus 1410, which may include, for example, a power supply, a light sensor, a light-emitting device, any combination thereof, or the like. In some example embodiments, one or more of the processing circuitry 1420, memory 1430, or one or more additional components 1440 may include a power device including any HEMT according to example embodiments described herein, such as the HEMTs in FIGS. 1A, 1B, and 9 to 13, as well as modifications of those HEMTs based on any one of the field dispersion layers 70a to 70f discussed in FIGS. 3 to 8. Accordingly, the electronic device 1400 may have a power device having improved electrical characteristics (e.g., reduced electron trap, a reduction of on-resistance) and thus improved performance and/or reliability.

HEMTs according to example embodiments described with reference to the above drawings may be used as, for example, a power device. However, the field of application of the HEMT according to the embodiment of the disclosure is not limited to the power device and can be variously changed. In other words, HEMTs according to example embodiments not only may be used as a power device, but also may be used for other purposes such as an RF switching device and the like.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A high electron mobility transistor comprising:
   a channel layer;
   a barrier layer on the channel layer and having an energy bandgap greater than an energy bandgap of the channel layer;
   a gate structure on the barrier layer;
   a source electrode and a drain electrode spaced apart from each other on the barrier layer with the gate structure therebetween;
   a field plate electrically connected to the source electrode and extending above the gate structure; and
   a field dispersion layer in contact with the barrier layer and the drain electrode, the field dispersion layer extending toward the gate structure.

2. The high electron mobility transistor of claim 1, wherein a partial area of the barrier layer does not overlap the field dispersion layer.

3. The high electron mobility transistor of claim 2, wherein the partial area of the barrier layer is between the gate structure and the drain electrode.

4. The high electron mobility transistor of claim 1, wherein an interval between the field plate and the field dispersion layer in a widthwise direction of the channel layer is less than an interval between the gate structure and the drain electrode in the widthwise direction.

5. The high electron mobility transistor of claim 1, wherein a portion of the field dispersion layer overlaps the field plate in a thickness direction of the channel layer.

6. The high electron mobility transistor of claim 1, wherein a host material of the field dispersion layer comprises a same material as the barrier layer.

7. The high electron mobility transistor of claim 1, wherein the field dispersion layer comprises a p-type doped semiconductor material.

8. The high electron mobility transistor of claim 1, wherein the field dispersion layer comprises a plurality of first field dispersion layers arranged apart from each other in a direction crossing a widthwise direction of the channel layer.

9. The high electron mobility transistor of claim 8, wherein the plurality of first field dispersion layers are arranged apart from each other in a direction perpendicular to a widthwise direction of the channel layer.

10. The high electron mobility transistor of claim 8, wherein at least one of the plurality of first field dispersion layers is in contact with the drain electrode.

11. The high electron mobility transistor of claim 8, wherein at least one of the plurality of first field dispersion layers is in contact with the gate structure.

12. The high electron mobility transistor of claim 8, wherein
   the field dispersion layer further comprises a second field dispersion layer,
   one end of the second field dispersion layer is in contact with the plurality of first field dispersion layers, and
   an other end of the second field dispersion layer is in contact with the drain electrode.

13. The high electron mobility transistor of claim 1, wherein the field dispersion layer comprises a mesh structure.

14. The high electron mobility transistor of claim 1, wherein a thickness of the field dispersion layer is less than a thickness of the barrier layer.

15. The high electron mobility transistor of claim 1, wherein the gate structure comprises a gate electrode, a first semiconductor layer, and a second semiconductor layer that are sequentially arranged on the barrier layer.

16. The high electron mobility transistor of claim 15, wherein at least one material in the first semiconductor layer is different than at least one material in the second semiconductor layer.

17. The high electron mobility transistor of claim 1, further comprising:
   an etch stop layer between the barrier layer and the gate structure, wherein the etch stop layer is between the barrier layer and the field dispersion layer.

18. A high electron mobility transistor comprising:

a channel layer;

a barrier layer on the channel layer, the barrier layer configured to form a two-dimensional gas (2DEG) in the channel layer;

a source electrode and a drain electrode spaced apart from each other and connected to a first end of the barrier layer and a second end of the barrier layer, respectively;

a gate structure on a portion of the barrier layer between the first end of the barrier layer and the second end of the barrier layer, the gate structure being configured to form a depletion region in the 2DEG below the gate structure;

a field plate electrically connected to the source electrode and extending above the gate structure; and a field dispersion layer on the barrier layer between the gate structure and the drain electrode, the field dispersion layer contacting the drain electrode, and the field dispersion layer including a p-type doped semiconductor material.

19. The high electron mobility transistor of claim 18, wherein an interval between the field plate and the field dispersion layer in a widthwise direction of the channel layer is less than an interval between the gate structure and the drain electrode in the widthwise direction, or a portion of the field dispersion layer overlaps the field plate in a thickness direction of the channel layer.

20. The high electron mobility transistor of claim 18, wherein a thickness of the field dispersion layer is less than a thickness of the barrier layer.

* * * * *